United States Patent
Goncharenko et al.

(10) Patent No.: US 6,261,424 B1
(45) Date of Patent: Jul. 17, 2001

(54) METHOD OF FORMING DIAMOND-LIKE CARBON COATING IN VACUUM

(75) Inventors: Valery Pavlovich Goncharenko; Alexander Jakovlevich Kolpakov; Anatoly Ivanovitch Maslov, all of Belgorod (RU)

(73) Assignee: Patinor AS, Oslo (NO)

( * ) Notice: Subject to any disclaimer, the term of this patent is extended or adjusted under 35 U.S.C. 154(b) by 0 days.

(21) Appl. No.: 09/424,763

(22) PCT Filed: May 28, 1998

(86) PCT No.: PCT/NO98/00158

§ 371 Date: Feb. 24, 2000

§ 102(e) Date: Feb. 24, 2000

(87) PCT Pub. No.: WO98/54376

PCT Pub. Date: Dec. 3, 1998

(30) Foreign Application Priority Data

May 30, 1997 (RU) .................................. 97108626009261

(51) Int. Cl.$^7$ .................................................. C23C 14/34
(52) U.S. Cl. .................... 204/192.38; 427/301; 427/304
(58) Field of Search ................ 204/192.16, 192.38; 427/301, 304, 350

(56) References Cited

U.S. PATENT DOCUMENTS

| | | | |
|---|---|---|---|
| 5,401,543 | * 3/1995 | O'Neill et al. ................... | 427/580 |
| 5,527,596 | 6/1996 | Kimock et al. .................. | 428/216 |
| 6,100,628 | * 8/2000 | Coll et al. ....................... | 313/310 |

FOREIGN PATENT DOCUMENTS

WO 94/12680  6/1994  (WO) ............................ C23C/14/00

OTHER PUBLICATIONS

Translation of select portions of U.S.S.R. Patent No. 411037, Oct. 1971.*

"Properties of tetrahedral amorphous carbon prepared by vacuum are deposition", Diamond and Related Materials, 1 (1991) 51–59.

"Principles and Applications of Vacuum Arc Coatings", Raymond L. Boxman, Fellow, Ieee, and S. Goldsmith.

"Structure and properties of carbon films prepared by pulsed vacuum are deposition", Surface and Coatings Technology, 47 (1991) 292–298.

"Nanolayered gradient structures as an intermediate layer for diamond coatings", Diamond and Related Materials, 3 (1994) 1107–1111.

"Intrinsiic Stresses Dynamics in Diamond–Like Carbon Films Growing from Pulsed Arc Plasma Flows", Valery V. Akulick, *Nicolay M. Chekan and Eduard I. Tochitsky.

* cited by examiner

Primary Examiner—Nam Nguyen
Assistant Examiner—Steven H. VerSteeg
(74) Attorney, Agent, or Firm—Browdy and Neimark

(57) ABSTRACT

A method of forming a diamond-like carbon coating in vacuum, comprising the steps of: pretreatment of the surface of the pad; placing the part into a vacuum chamber; treating the surface of the part with accelerated ions; applying a sublayer of a material onto the treated surface of the part; electric are vacuum sputtering a graphite cathode from a cathode spot and producing a carbon plasma accelerating an ion component of the carbon plasma; depositing the produced carbon plasma on the surface of the part and producing the diamond-like carbon coating. A pulsed electric are discharge is used, by which a plurality of cathode spots are excited at the end surface of the graphite cathode, cathode spots moving along the end surface of the cathode at a speed of from 10 to 30 m/s and generating a carbon plasma having an ion energy of 40 to 100 eV and an ion concentration in the plasma of $10^{12}$ to $10^{14}$ cm$^{-3}$, with electrically insulating the part in the vacuum chamber. The temperature of the part in the range of 200 to 450 K by controlling the repetition frequency of discharge pulses basis.

16 Claims, No Drawings

METHOD OF FORMING DIAMOND-LIKE CARBON COATING IN VACUUM

CROSS REFERENCE TO RELATED APPLICATION

The present application is the national stage under 35 U.S.C. 371 of PCT/NO98/00158, filed May 28, 1998.

The present invention relates to the field of producing superhard wear-resistant coatings in vacuum, and more specifically to a method of forming a diamond-like carbon coating in vacuum.

The invention may be used to increase the service life of cutting tools, measuring tools, friction assemblies and machine parts as well as in the medicine to improve the biological compatibility of implants, in the electronic engineering to increase the service life of audio and video heads, to improve characteristics of acoustic membranes, as coatings for optical parts, and as decorative coatings.

Known in the art is a method of producing high-hardness diamond-like carbon coatings on metal and dielectric substrates (cf., SU Inventor's Certificate No. 411037, 1975) wherein graphite is cathode-sputtered in a magnetic field at a low pressure of a noble gas, krypton, of $10^{-5}$ to $10^{-2}$ Pa to a cooled substrate having a temperature less than 100 K.

Said process has low productivity due to the low pressure of the processing gas, krypton, and low energetic characteristics of the glow discharge at this pressure. It is technologically difficult to maintain such low temperature of the parts to be treated. One has to complicate the processing equipment significantly to achieve ultrahigh vacuum.

The closest technical solution is a method of forming a diamond-like carbon coating in vacuum, comprising the steps of pretreatment of the surface of a part, placing the part into a vacuum chamber, treating the surface of the part with accelerated ions, applying a sublayer of a material onto the surface of the part, electric arc vacuum sputtering a graphite cathode from a cathode spot and producing a carbon plasma, accelerating an ion component of the carbon plasma, depositing the produced carbon plasma on the surface of the part and producing the diamond-like carbon coating (cf., D. R. McKenzie et al. "Properties of tetrahedral amorphous carbon prepared by vacuum arc deposition," Journal "Diamond and Related Materials," 1, 1991, p. 51–59).

In said method the sputtering of the cathode is performed in a stationary discharge from one cathode spot, the carbon plasma is produced, the plasma is separated, that is, cleaned from microparticles being formed in a stationary cathode spot. The ion component of the plasma is electrostatically accelerated by supplying a negative, high-frequency potential, and the diamond-like carbon coating is produced.

In said method the use of the stationary discharge does not permit to obtain the plasma energy necessary to form the diamond like carbon coating, that implies the necessity of additional accelerating the plasma ions by supplying a potential to the part. It results in heating the coating and deterioration of its properties, that is, decreased microhardness.

In addition, there arises a hazard of overheating small-size parts as well as sharp edges, that leads to their softening. If the part is made of a dielectric material the electrostatic acceleration has a small effect.

The stationary electric arc discharge is defined by presence of a movable cathode spot being a source of a low energy carbon plasma as well as a great number of hard graphite fragments escaping from the cathode spot. The ion energy does not exceed 10 to 15 eV. When striking the surface of the part, the graphite fragments considerably deteriorate the quality of the produced coating.

To eliminate this disadvantage, said method uses a curvilinear magnetic deflection system that significantly complicates the method of producing the coating. In addition, the stationary cathode spot being the source of the carbon plasma in said method, produces a narrow carbon plasma beam that does not permit application of a uniform diamond-like carbon coating on elongated parts.

The comparatively small plasma density, that is, the ion concentration implies enhanced requirements to the vacuum level to avoid contamination of the coating with residual gases and respective deterioration of the coating quality. The stationary nature of the process complicates the method of applying the coating because it becomes difficult to maintain the necessary temperature mode. The application of the diamond-like carbon coating onto small-size and film materials involves severe difficulties; in this case the coating properties are unstable.

A foundation of the present invention is the problem of creating a method of forming a diamond-like carbon coating in vacuum, wherein the use of a pulsed arc discharge for generating a plurality of cathode spots at the end surface of the cathode as well as maintaining the temperature of the part by means of changing a pulse repetition frequency will allow to simplify the method of forming the coating, to improve its stability and productivity, and to improve the quality of the formed coating, in particular, its uniformity and wear resistance.

The posed problem is solved by that a method of forming a diamond-like carbon coating in vacuum, comprising the steps of pretreatment of the surface of the part, placing the part into a vacuum chamber, treating the surface of the part with accelerated ions, applying a sublayer of a material onto the treated surface, electric arc vacuum sputtering a graphite cathode from a cathode spot and producing a carbon plasma, accelerating an ion component of the carbon plasma, depositing the produced carbon plasma on the surface of the part and producing the diamond-like carbon coating. According to the invention and in order to produce, accelerate and deposit the carbon plasma, said method comprising the steps of using a pulsed electric arc discharge by which a plurality of cathode spots are excited at the end surface of the graphite cathode, said spots moving along the end surface of the cathode at a velocity of 10 to 30 m/s and generating the carbon plasma having an ion energy of 40 to 100 eV and a concentration of ions in the plasma of $10^{12}$ to $10^{14}$ cm$^{-3}$, with the part being electrically insulated in the vacuum chamber, and maintaining the temperature of the part in the range 200 to 450 K by controlling the discharge pulse repetition frequency.

It is helpful to use metal ions as the accelerated ions in treating a metal part.

It is expedient to use as the sublayer material a metal of thickness 100 to 500 Å; used for said purpose was a metal selected from the group consisting of titanium. chromium, molybdenum, zirconium, niobium, tungsten.

It is advantageous to increase the temperature of the part up to a value in the range of 473 to 573 K in treating the surface of the part with the accelerated ions of a metal and then to cool the part to a temperature of 293 to 300 K and to re-treat the surface of the part with accelerated ions of a metal until the temperature reaches 323 K.

It is expedient to perform the method in an argon atmosphere at a pressure of $10^{-2}$ to $10^{-1}$ Pa.

It is helpful to use ions of a gas as the accelerated ions in treating a dielectric part, said gas being selected from the group consisting of argon, nitrogen, oxygen or a mixture thereof.

It is advantageous to apply a sublayer of aluminum nitride of thickness 50 to 200 A to a glass part in treating thereof.

It is expedient to use as the graphite cathode a highly purified graphite wherein the pore amount is about 0.5%.

It is helpful to use as the graphite cathode a graphite with an admixture of a doping element which is an element selected from the group consisting of silicon, germanium, osmium, bismuth, phosphorus, and antimony.

It is advantageous to sputter an additional cathode made of a metal selected from the group consisting of titanium, chromium, aluminiumn, zirconium, silicon, germanium.

It is also helpful to treat the diamond-like carbon coating formed on the part with accelerated ions of a gas or a metal.

The invention will now be described in detail with reference to various specific embodiments thereof.

The method of forming a diamond-like carbon coating in vacuum is performed as follows.

The surface of a part is mechanically prepared and then degreased. After that the part is placed into a special fixture in a vacuum chamber and fastened. The arc current is set to be 60 to 80 A, a negative potential of 1000 to 1500 V is being supplied to the part. In this manner the treating with accelerated ions is performed.

Then the potential to be supplied to the part is lowered to 100 V and a sublayer of a metal of thickness 100 to 500 A is applied to the treated surface. It is possible to use a metal selected from the group consisting of titanium, chromium, molybdenum, zirconium, niobium, tungsten.

Then the electric arc vacuum sputtering of the graphite cathode is performed and the carbon plasma is produced. Used for this purpose is the pulsed electric arc discharge that has the following parameters: the voltage in a capacitor battery of a capacitance of 2000 $\mu$F is 300 V; the discharge time is 0,5 ms; the repetition frequency of pulses is from 1 to 20 Hz. Under such conditions a plurality of cathode spots is excited at the end surface of the graphite cathode. Said cathode spots move along the end surface of the cathode at a speed of 10 to 30 m/s and generate a carbon plasma having an ion energy of 40 to 100 eV and an ion concentration in the plasma of $10^{12}$ to $10^{14}$ cm$^{-3}$. As this takes place, a potential is not supplied to the part and the part itself is insulated from all electrodes and the housing of the vacuum chamber.

The temperature of the part is maintained in the range of 200 to 450 K by controlling the repetition frequency of discharge pulses.

The produced carbon plasma is deposited on the surface of the part and the diamond-like carbon coating is produced.

If it is found, visually or under a microscope, after the preliminary treating, that the treating was ineffective and oxide films remain on the surface of the part, then, the duration of ion treating of the surface with accelerated ions of a metal is increased, the temperature of the part being increased to the value of 473 to 573 K. Then the part is cooled to a temperature in the range of 293 to 300 K. The surface of the part is re-treated with accelerated ions of a metal until the temperature reaches 323 K.

To improve the intensity of purification, the ion treating is performed in an argon atmosphere at a pressure of $10^{-2}$ to $10^{-1}$ Pa.

In treating a dielectric part, ions of a gas are used as the accelerated ions, said gas being selected from the group consisting of argon, nitrogen, oxygen or a mixture thereof.

In treating a glass part, after gas ion treating, applied to the glass is an aluminum nitride layer of thickness 50 to 200 A to enhance adhesion between the diamond-like carbon coating and the surface of the glass part.

Used as the graphite cathode in said method is a highly purified graphite wherein the pore amount is about 0.5%. To improve the quality of the diamond-like carbon coating, used is a highly purified graphite having a minimum pore amount because the pores enclose such impurities as gaseous nitrogen, oxygen, water vapour. When penetrating into the coating to be formed the impurities decrease its quality.

To obtain semiconducting properties of the diamond-like carbon coating, used as the graphite cathode is a graphite having an admixture of a doping element which is an element selected from the group consisting of silicon, germanium, osmium, bismuth, phosphorus, antimony.

If a diamond-like carbon coating with a different value of electrical resistance is needed, an additional cathode is sputtered, said cathode being made of a metal selected from the group consisting of titanium, chromium, aluminum, zirconium, silicon and germanium.

To change optical and electrical characteristics as well as to obtain a pattern on the coating, the diamond-like carbon coating formed on the part is treated with accelerated ions of a gas or a metal.

EXAMPLE 1

Used was a polished sample of a hardened carbon steel having dimensions of 20×20×20 mm, said sample was fastened in a special fixture, placed into the vacuum chamber, and the chamber was evacuated to a pressure of $5\times10^{-3}$ Pa. The ion treating was performed with titanium ions generated by the electric arc plasma source having a titanium cathode. A negative potential of 1000 V was supplied to the sample. An arc current of 80 A was set. The treating time was 5 minutes. Then the potential was lowered to 100 V and a titanium sublayer of 200 A was applied. Then a diamond like carbon coating of 10 micrometers was applied by electrical arc sputtering the graphite cathode in the pulsed discharge without supplying a potential to the sample and with the following parameters: the voltage in the capacitor battery of a capacitance of 2000$\mu$F was 300 V; the discharge time was 0,5 ms; the repetition frequency was 10 Hz. As this took place, the ion energy was 70 V, the plasma density was $1\times10^{13}$ cm$^{-3}$. The temperature of the sample was increased to 423 K.

Graphite impurities in the coating were not found by the ESCA (electron spectral chemical analysis) method.

The microhardness of the diamond-like carbon coating was 8000 HV at a load of 100 g. The coefficient of friction on titanium nitride was 0.04, the coefficient of friction on a hardened steel was 0.08, the coefficient of friction on copper was 0.1.

It was established by X-ray analysis that the coating was amorphous.

EXAMPLE 2

Used was an artificial heart valve made of titanium, said valve was fastened in a special fixture, placed into the vacuum chamber, and the chamber was evacuated to a pressure of $5\times10^{-3}$ Pa. The ion treating was performed with titanium ions generated by an electric arc plasma source having a titanium cathode. A negative potential of 1000 V was supplied to the valve. An arc current of 80 A was set. The treating time was 5 minutes. After that the potential of the valve was lowered to 100 V and a titanium sublayer of thickness 500 A was applied. Then a diamond-like carbon coating of 2 micrometers was applied by electrical arc sputtering the graphite cathode in the pulsed discharge without supplying a potential to the valve and with the following parameters: the voltage in the capacitor battery of a capacitance of 2000 $\mu$F was 300 V; the discharge time was 0,5 ms; the repetition frequency was 3 Hz. As this took place, the ion energy was 70 V, the plasma density was $1\times10^{13}$ cm$^{-3}$. The temperature of the valve was increased up to 423 K.

It was established by X-ray analysis that the coating was amorphous.

It was established by medical and biological studies that the coating had satisfactory biological compatibility properties.

EXAMPLE 3

Used was a cutting plate made of a hard alloy for treating light-weight aluminum-based alloys. Said plate was fastened in a special fixture, placed into the vacuum chamber, and the chamber was evacuated to a pressure of $5\times10^{-3}$ Pa. The ion treating was performed with titanium ions generated by an electric arc plasma source having a titanium cathode. A negative potential of 1500 V was supplied to the plate. An arc current of 80 A was set. The treating time was 5 minutes. Then the plate was cooled to a temperature of 300 K. The ion treatment was repeated for 1 minute. After that the potential of the plate was lowered to 100 V and a titanium sublayer of 200 A was applied. Then a diamond-like carbon coating of 2 micrometers was applied by electrical arc sputtering the graphite cathode in the pulsed discharge without supplying a potential to the plate and with the following parameters: the voltage in the capacitor battery of a capacitance of 2000 $\mu$F was 300 V; the discharge time was 0,5 ms; the repetition frequency was 10 Hz. As this took place, the ion energy was 70 V, the plasma density was $1\times10^{13}$ cm$^{-3}$. The temperature of the plate was increased up to 423 K.

The microhardness of the diamond-like carbon coating was 8000 HV at a load of 100 g. The coefficient of friction on aluminum was 0.12.

The production test of the hard alloy plate, performed under conditions of full-scale production of an automobile plate, has shown an increase in its service life and improved surface quality.

It was established by X-ray analysis that the coating was amorphous.

What is claimed is:

1. In a method of forming a diamond-like carbon coating in a vacuum, comprising:
    pretreatment of a surface of a part to be coated;
    placing the part into a vacuum chamber;
    treating the surface of the part with accelerated ions;
    applying a sublayer of a material onto the treated surface of the part;
    electric arc vacuum sputtering a graphite cathode from a cathode spot and producing a carbon plasma;
    accelerating an ion component of the carbon plasma;
    depositing the produced carbon plasma onto the surface of the part and thus producing the diamond-like carbon coating;
    the improvement wherein
        in order to produce, accelerate and deposit the carbon plasma, said method comprising using a pulsed electric arc discharge at a repitition frequency by which a plurality of cathode spots are excited at an end surface of the graphite cathode, said cathode spots moving in the end surface of the graphite cathode at a speed of from 10 to 30 ms and generating a carbon plasma having an ion energy of 40 to 100 eV and an ion concentration in the plasma of $10^{12}$ to $10^{14}$ cm$^{-3}$, with the part being electrically insulated in the vacuum chamber, and
    maintaining a temperature of the part in the range of 200 to 450 K by controlling the repetition frequency of discharge pulses.

2. A method according to claim 1, characterized in using metal ions as the accelerating ions in treating a metal part.

3. A method, according to claim 2, characterized in using as the sublayer material a metal selected from the group consisting of titanium, chromium, molybdenum, zirconium, niobium, and tungsten, said metal sublayer having a thickness of 100 to 500 A.

4. A method according to claim 3, characterized in increasing the temperature of the part from 473 to 573 K in treating the surface of the part;
subsequent cooling the temperature of the part from 293 to 300 K;
re-treating the surface of the part with accelerated ions of a metal until the temperature reaches 323 K.

5. A method according to claim 4, characterized in that the method is performed in an argon atmosphere at a pressure of $10^{-2}$ to $10^{-1}$ Pa.

6. A method according to claim 3, characterized in that the method is performed in an argon atmosphere at a pressure of $10^{-2}$ to $10^{-1}$ Pa.

7. A method according to claim 2, characterized in increasing the temperature of the part from 473 to 573 K in treating the surface of the part;
subsequent cooling the temperature of the part from 293 to 300 K;
re-treating the surface of the part with accelerated ions of a metal until the temperature reaches 323 K.

8. A method according to claim 7, characterized in that the method is performed in an argon atmosphere at a pressure of $10^{-2}$ to $10^{-1}$ Pa.

9. A method according to claim 2, characterized in that the method is performed in an argon atmosphere at a pressure of $10^{-2}$ to $10^{-1}$ Pa.

10. A method according to claim 1, characterized in using gas ions selected from the group consisting of argon ions, nitrogen ions, oxygen ions and mixture thereof, said gas ions comprising the accelerating ions in treating a dielectric part.

11. A method according to claim 1, characterized in preliminary applying an aluminum nitride layer of thickness 50 to 200 A to a glass part in treating thereof.

12. A method according to claim 1, characterized in using as the graphite cathode a purified graphite having a pore amount of about 0.5%.

13. A method according to claim 1, characterized in using as the graphite cathode a graphite having an admixture of a doping element which is an element selected from the group consisting of silicon, germanium, osmium, bismuth, phosphorus, antimony.

14. A method according to claim 1, characterized in sputtering an additional cathode made of a material selected from the group consisting of titanium, chromium, aluminum, zirconium, silicon and germanium.

15. A method according to claim 1, characterized in treating the diamond-like carbon coating formed on the part with accelerated ions of a gas or a metal.

16. A method of forming a diamond-like carbon coating on a substrate, comprising:

treating a surface of the substrate to be coated with accelerated metal ions in a vacuum;

applying a sublayer of a material onto the treated surface of the substrate in said vacuum;

electric arc sputtering a graphite cathode in said vacuum from a cathode spot and producing a carbon plasma using a pulsed electric arc discharge by which a plurality of cathode spots are excited at an end surface of the graphite cathode whereby said cathode spots move along the end surface of the graphite cathode at a speed of from 10–30 m/s and said carbon plasma has an ion energy of 40–100 eV and an ion concentration in the plasma of $10^{12}$ to $10^{14}$ cm$^{-3}$;

maintaining a temperature of said substrate of 200–400 K while maintaining said substrate electrically insulated under said vacuum; and depositing the produced carbon plasma in said vacuum onto said surface of said substrate to produce said diamond-like carbon coating.

* * * * *